(12) United States Patent
Yang et al.

(10) Patent No.: US 7,956,463 B2
(45) Date of Patent: Jun. 7, 2011

(54) LARGE GRAIN SIZE CONDUCTIVE STRUCTURE FOR NARROW INTERCONNECT OPENINGS

(75) Inventors: Chih-Chao Yang, Albany, NY (US); Daniel C. Edelstein, Yorktown Heights, NY (US); Takeshi Nogami, Albany, NY (US); Stephen M. Rossnagel, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/560,878

(22) Filed: Sep. 16, 2009

(65) Prior Publication Data

US 2011/0062587 A1    Mar. 17, 2011

(51) Int. Cl.
*H01L 23/48* (2006.01)

(52) U.S. Cl. .. 257/751; 257/750; 257/767; 257/E23.011

(58) Field of Classification Search ................ 257/751, 257/E23.011, 750, 758, 767; 438/627, 629, 438/643, 648, 656

See application file for complete search history.

(56) References Cited

U.S. PATENT DOCUMENTS

| | | | |
|---|---|---|---|
| 6,319,728 B1 | 11/2001 | Bhan et al. | |
| 6,506,668 B1 | 1/2003 | Woo et al. | |
| 7,122,466 B2 | 10/2006 | Park et al. | |
| 7,235,487 B2 | 6/2007 | Barkyoumb et al. | |
| 7,282,445 B2 | 10/2007 | Cohen | |
| 7,545,040 B2 * | 6/2009 | Ueki et al. | 257/751 |
| 7,566,653 B2 * | 7/2009 | Yang et al. | 438/627 |
| 7,666,787 B2 * | 2/2010 | Yang et al. | 438/660 |
| 7,790,612 B2 * | 9/2010 | Nakamura et al. | 438/660 |
| 2002/0105082 A1 | 8/2002 | Andricacos et al. | |
| 2002/0171151 A1 | 11/2002 | Andricacos et al. | |
| 2006/0183326 A1 | 8/2006 | Yoo et al. | |
| 2006/0208272 A1 | 9/2006 | Ritzdorf et al. | |
| 2007/0197012 A1 | 8/2007 | Yang et al. | |
| 2009/0206484 A1 | 8/2009 | Baker-O'Neal et al. | |

* cited by examiner

*Primary Examiner* — Roy K Potter (74) *Attorney, Agent, or Firm* — Scully, Scott, Murphy & Presser, P.C.; Louis J. Percello, Esq.

(57) ABSTRACT

An interconnect structure having reduced electrical resistance and a method of forming such an interconnect structure are provided. The interconnect structure includes a dielectric material including at least one opening therein. The at least one opening is filled with an optional barrier diffusion layer, a grain growth promotion layer, an agglomerated plating seed layer, an optional second plating seed layer a conductive structure. The conductive structure which includes a metal-containing conductive material, typically Cu, has a bamboo microstructure and an average grain size of larger than 0.05 microns. In some embodiments, the conductive structure includes conductive grains that have a (111) crystal orientation.

21 Claims, 4 Drawing Sheets

LARGE GRAIN SIZE CONDUCTIVE STRUCTURE FOR NARROW INTERCONNECT OPENINGS

BACKGROUND

The present invention relates to a semiconductor structure and a method of fabricating the same. More particularly, the present invention relates to an interconnect structure of the single or dual damascene type in which a large grain size conductive structure is employed to reduce resistivity of conductive lines and/or vias, especially narrow conductive lines and/or vias having a feature size below 75 nm.

Generally, semiconductor devices include a plurality of circuits which form an integrated circuit fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. The wiring structure typically includes copper, Cu, since Cu based interconnects provide higher speed signal transmission between large numbers of transistors on a complex semiconductor chip as compared with aluminum, Al, -based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than silicon dioxide.

One major problem with prior art interconnect structures is that the conductive material within the conductive region has a low electromigration resistance due to a high number of electromigration paths inside the conductive region. The high number of paths is believed to be a result of the microstructure and the average grain size of the conductive material. As is known to those skilled in the art, electromigration is predominately driven by (1) interface diffusion between the conductive material and the dielectric cap, and (2) bulk diffusion along the grain boundaries of the conductive material. The electromigration problem is expected to increase in future semiconductor technologies due to the scaling of such devices.

BRIEF SUMMARY

One problem addressed in the present invention is the high electrical resistivity that is exhibited for conductive lines and vias. This becomes a significant problem as the features sizes of the conductive lines and/or vias decline below 75 nm. A large fraction of the high resistivity can be attributed to small grain size (on the order of 0.02 microns or less) in the conductive features, such as, for example copper, Cu, features. Grain boundary scattering can cause an increase in resistance in conductive metals. The small grain size of the conductive material within the conductive features is caused by prior process technology used in forming the same. Grain growth that was observed in larger dimension generations is not seen in very small features as grain boundary motion from the overburden does not extend down into small features.

In accordance with an aspect of the present invention, a method of forming an interconnect structure is provided that substantially reduces, and in some instances eliminates, the high electrical resistance that is exhibited by prior art interconnect structures. In one embodiment of the invention, the method includes forming at least one opening in a dielectric material. A grain growth promotion layer is thereafter formed within the at least one opening. After formation of the grain growth promotion layer, an agglomerated plating seed layer is formed on the exposed surfaces of the grain growth promotion layer. The agglomerated plating seed layer is formed by deposition and a subsequent first anneal. The first anneal is performed under conditions that cause agglomeration of a deposited plating seed layer within the at least one opening. Much of the agglomeration occurs inside the at least one opening, not on the top horizontal surfaces of the structure. After the first anneal, a conductive structure is formed within the at least one opening. The conductive structure is formed by deposition of a metal-containing conductive material followed by a subsequent second anneal that causes grain growth of the metal-containing conductive material.

In one embodiment, a diffusion barrier is formed within the at least one opening prior to forming the grain growth promotion layer within the at least one opening. In another embodiment, another plating seed layer can be formed within the at least one opening between the steps of the forming the agglomerated plating seed layer and forming the conductive structure.

The method described above creates a conductive structure within the at least one opening that has a bamboo microstructure and an average grain size of larger than 0.05 microns. In some embodiments, the conductive structure within the at least one opening includes grains that have a (111) crystal orientation.

In another aspect of the invention, an interconnect structure having reduced electrical resistance is provided. The interconnect structure includes a dielectric material including at least one opening therein. The at least one opening is filled with a grain growth promotion layer, an agglomerated plating seed layer which is located on upper surfaces of the grain growth promotion layer, and a conductive structure which is located above upper surfaces of the agglomerated plating seed layer. The conductive structure, which includes a metal-containing conductive material, typically Cu, has a bamboo microstructure and an average grain size of larger than 0.05 microns. In some embodiments, the conductive structure includes grains that have a (111) crystal orientation.

In some embodiments of the invention, a diffusion barrier is present within the at least one opening. The diffusion barrier is located between exposed sidewalls of the dielectric material including the at least one opening and the grain growth promotion layer. In a further embodiment of the invention, another plating seed layer is located between the agglomerated plating seed layer and the conductive structure.

DESCRIPTION OF SEVERAL VIEWS OF THE DRAWINGS

FIGS. 7A and 7B are pictorial representations (through cross sectional views) depicting alternative interconnect structures that can be formed in the present invention; FIG. 7A includes an interconnect structure with an open-via bottom structure, while FIG. 7B includes an interconnect structure with an anchored-via bottom structure.

DETAILED DESCRIPTION

In the following description, numerous specific details are set forth, such as particular structures, components, materials, dimensions, processing steps and techniques, in order to provide an understanding of some aspects of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Embodiments of the present invention will now be described in greater detail by referring to the following discussion and drawings that accompany the present application. The drawings of the present application, which are referred to herein below in greater detail, are provided for illustrative purposes and, as such, they are not drawn to scale.

Figure 1:
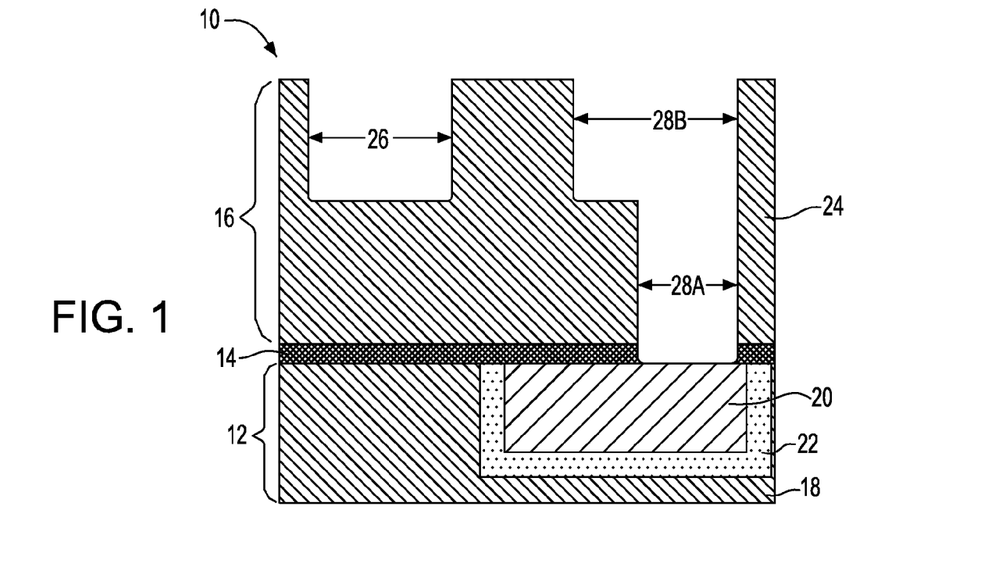
FIG. 1 is a pictorial representation (through a cross sectional view) illustrating an interconnect structure in accordance with an embodiment of the invention through initial stages wherein at least one opening is provided in a dielectric material.

Reference is first made to FIG. 1 which illustrates an initial interconnect structure 10 that can be employed in some embodiments of the invention. Specifically, the initial interconnect structure 10 shown in FIG. 1 includes a multilevel interconnect including a lower interconnect level 12 and an upper interconnect level 16 that are separated in part by dielectric capping layer 14. The lower interconnect level 12, which may be located above a semiconductor substrate including one or more semiconductor devices, comprises a first dielectric material 18 having at least one conductive feature (i.e., conductive region) 20 that is separated from the first dielectric material 18 by a barrier layer 22. The upper interconnect level 16 comprises a second dielectric material 24 that has at least one opening located therein. In FIG. 1, two openings are shown; reference number 26 denotes a line opening for a single damascene structure, and reference numeral 28A and 28B denote a via opening and a line opening, respectively for a dual damascene structure. Although FIG. 1 illustrates a separate line opening and an opening for a via and a line, the present invention also contemplates cases in which only the line opening is present or cases in which the opening for the combined via and line is present. The feature size of the at least one opening may vary. In some embodiments, the feature size of the at least one opening is below 75 nm.

The initial interconnect structure 10 shown in FIG. 1 can be made utilizing standard interconnect processing which is well known in the art. For example, the initial interconnect structure 10 can be formed by applying the first dielectric material 18 to a surface of a substrate (not shown). The substrate, which is not shown, may include a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other MN or compound semiconductors can be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

The first dielectric material 18 of the lower interconnect level 12 may include any interlevel or intralevel interconnect dielectric including inorganic dielectrics or organic dielectrics. The first dielectric material 18 may be porous or non-porous. Some examples of suitable dielectrics that can be used as the first dielectric material 18 include, but are not limited to $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first dielectric material 18 typically has a dielectric constant that is about 4.0 or less, with a dielectric constant of about 2.8 or less being more typical. These dielectrics generally have a lower parasitic cross talk as compared with dielectric materials that have a higher dielectric constant than 4.0. The thickness of the first dielectric material 18 may vary depending upon the dielectric material used as well as the exact number of dielectrics within the lower interconnect level 12. Typically, and for normal interconnect structures, the first dielectric material 18 has a thickness from 200 nm to 450 nm.

The lower interconnect level 12 also has at least one conductive feature 20 that is embedded in (i.e., located within) the first dielectric material 18. The conductive feature 20 comprises a conductive region that is separated from the first dielectric material 18 by a barrier layer 22. The conductive feature 20 can be formed by lithography (i.e., applying a photoresist to the surface of the first dielectric material 18, exposing the photoresist to a desired pattern of radiation, and developing the exposed resist utilizing a conventional resist developer), etching (dry etching or wet etching) an opening in the first dielectric material 18 and filling the etched region with the barrier layer 22 and then with a conductive material forming the conductive region. The barrier layer 22, which may comprise Ta, TaN, Ti, TiN, Ru, RuN, W, WN or any other material that can serve as a barrier to prevent conductive material from diffusing there through, is typically formed by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the barrier layer 22 may vary depending on the exact means of the deposition process as well as the material employed. Typically, the barrier layer 22 has a thickness from 4 nm to 40 nm, with a thickness from 7 nm to 20 nm being more typical.

Following the barrier layer 22 formation, the remaining region of the opening within the first dielectric material 18 is filled with a conductive material forming the conductive region. The conductive material used in forming the conductive region includes, for example, polySi, a conductive metal, an alloy comprising at least one conductive metal, a conductive metal silicide or combinations thereof. Preferably, the conductive material that can be used in forming the conductive region is a metal-containing conductive material such as, for example, Cu, W or Al, with Cu or a Cu alloy (such as AlCu) being preferred in some embodiment of the present invention. The conductive material can be filled into the remaining opening in the first dielectric material 18 utilizing a conventional deposition process including, but not limited to CVD, PECVD, sputtering, chemical solution deposition or plating. After deposition, a conventional planarization process such as, for example, chemical mechanical polishing (CMP) can be used to provide a structure in which the barrier layer 22 and the conductive feature 20 each have an upper surface that is substantially coplanar with the upper surface of the first dielectric material 18.

Although not specifically illustrated, the inventive method described herein below can be used to provide the conductive feature 20 with a conductive structure having a bamboo microstructure and an average grain size of larger than 0.05 microns. The term "average grain size" is used throughout this application to denote the average grain size of the conductive material of the conductive structure. The average grain size is measured utilizing standard techniques such as, for example, by placing a polished and etched specimen under a microscope and counting the number of grains inside a certain area, that are well known to those skilled in the art. The average grain size inside the microstructure is then calculated based on the known magnification, the number of grains, and the inspected area.

After forming the at least one conductive feature 20, a dielectric capping layer 14 can be formed on the surface of the lower interconnect level 12 utilizing a conventional deposition process such as, for example, CVD, PECVD, chemical solution deposition, or evaporation. In some embodiments, dielectric capping layer 14 is omitted. The dielectric capping layer 14 includes any suitable dielectric capping material such as, for example, SiC, $Si_4NH_3$, $SiO_2$, a carbon doped oxide, a nitrogen and hydrogen doped silicon carbide SiC(N, H) or multilayers thereof. The thickness of the capping layer 14 may vary depending on the technique used to form the same as well as the material make-up of the layer. Typically, the capping layer 14 has a thickness from 15 nm to 55 nm, with a thickness from 25 nm to 45 nm being more typical.

Upper interconnect level 16 is formed by applying the second dielectric material 24 to the upper exposed surface of the dielectric capping layer 14, if present, or directly atop the lower interconnect level 12 when the dielectric capping layer 14 is not present. The second dielectric material 24 may comprise the same or different, preferably the same, dielectric material as that of the first dielectric material 18 of the lower interconnect level 12. The processing techniques and thickness ranges for the first dielectric material 18 are also applicable here for the second dielectric material 24. At least one opening is formed into the second dielectric material 24 utilizing lithography, as described above, and etching. The etching may comprise a dry etching process, a wet chemical etching process or a combination thereof. The term "dry etching" is used herein to denote an etching technique such as reactive-ion etching, ion beam etching, plasma etching or laser ablation. In FIG. 1, two openings are shown; reference number 26 denotes a line opening for a single damascene structure, and reference numeral 28A and 28B denote a via opening and a line opening, respectively for a dual damascene structure. It is again emphasized that the present invention contemplates structures including only opening 26 or openings 28A and 28B.

In the instances when a via opening 28A and a line opening 28B are formed, the etching step also removes a portion of the dielectric capping layer 14 that is located atop the conductive feature 20 in order to make electrical contact between interconnect level 12 and level 16.

An optional diffusion barrier 30 having diffusion barrier properties can be provided by forming the optional diffusion barrier 30 on all exposed surfaces (including wall surfaces within the opening) of the second dielectric material 24. The resultant structure including the optional barrier layer 30 is shown, for example, in FIG. 2. The optional diffusion barrier 30 comprises a same or different material as that of barrier layer 22. Thus, optional diffusion barrier 30 may comprise Ta, TaN, Ti, TiN, Ru, RuN, W, WN or any other material that can serve as a barrier to prevent a conductive material from diffusing there through. Combinations of these materials are also contemplated forming a multilayered stacked diffusion barrier. The optional diffusion barrier 30 can be formed utilizing a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

Figure 2:
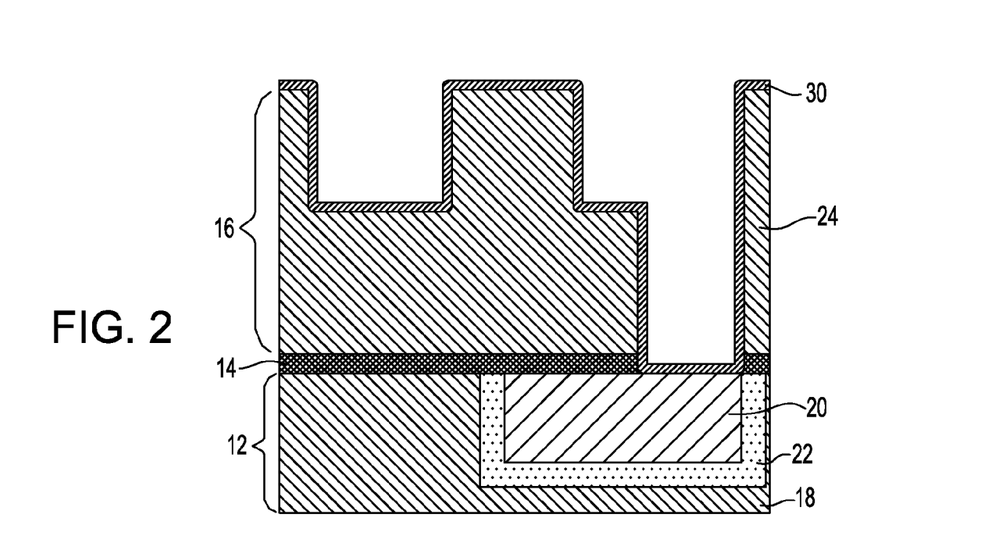
FIG. 2 is a pictorial representation (through a cross sectional view) illustrating the interconnect structure of FIG. 1 after formation of an optional diffusion barrier inside the at least one opening.

When the optional diffusion barrier is present, the thickness of the optional diffusion barrier 30 may vary depending on the number of material layers within the barrier, the technique used in forming the same as well as the material of the diffusion bather itself. Typically, the optional diffusion bather 30 has a thickness from 4 nm to 40 nm, with a thickness from 7 nm to 20 nm being even more typical.

Figure 3:
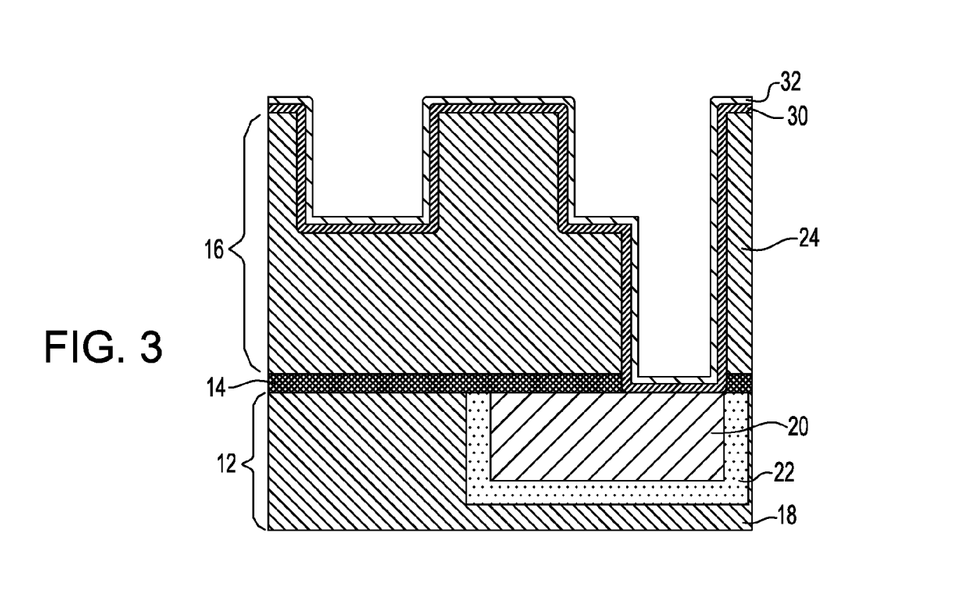
FIG. 3 is a pictorial representation (through a cross sectional view) illustrating the interconnect structure of FIG. 2 after formation of a grain growth promotion layer within the at least one opening.

FIG. 3 shows the structure of FIG. 2 after formation of grain growth promotion layer (GGPL) 32 atop the optional diffusion barrier 30. In embodiments in which the optional diffusion barrier 30 is not present, the GGPL 32 would be formed on exposed surfaces of the second dielectric material 24 including in each of the openings. The GGPL 32 is comprised of any material, typically a metal or metal alloy, which aids in the formation of a conductive material that has an average grain size of larger than 0.05 microns. Examples of suitable materials for the GGPL 32 include, but are not limited to Ru, Co, Ir, Rh, Mo, Re, Hf, Nb and alloys thereof. In some embodiments, Ru, Ir, Co or Rh are preferably used as the GGPL 32.

The GGPL 32 can be formed by a conventional deposition process including, for example, chemical vapor deposition (CVD), plasma enhanced chemical vapor deposition (PECVD), atomic layer deposition (ALD), and physical vapor deposition (PVD). The thickness of the GGPL 32 may vary depending on number of factors including, for example, the compositional material of the GGPL 32 and the technique that was used in forming the same. Typically, the GGPL 32 has a thickness from 0.5 nm to 10 nm, with a thickness of less than 6 nm being even more typical.

Without wishing to be bound by any theory, it is believed that the GGPL 32 aids in the formation of the conductive structure having a bamboo microstructure and an average grain size of greater than 0.05 microns by a low interfacial energy between the GGPL 32 and later deposited plating seed layer(s)/metal-containing conductive material.

Figure 4:
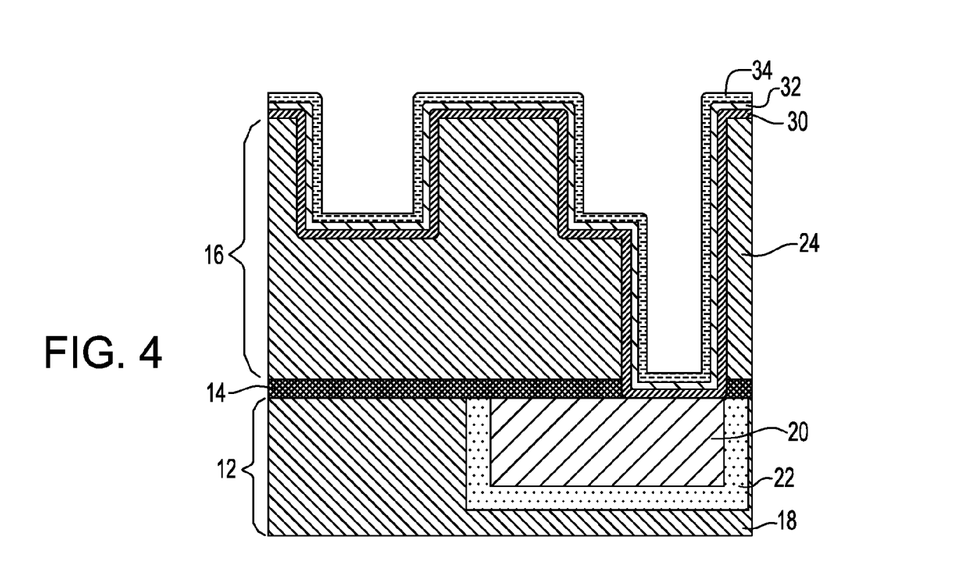
FIG. 4 is a pictorial representation (through a cross sectional view) illustrating the interconnect structure of FIG. 3 after formation of a plating seed layer.

FIG. 4 shows the resultant structure formed after forming a plating seed layer 34. The plating seed layer 34 aids in the growth of a subsequently formed metal-containing conductive material within the at least one opening. The plating seed layer 34 may comprise a conductive metal or metal alloy such as that used in forming the conductive structure 38 to be described in greater detail herein below. Typically, and when the conductive structure 38 includes Cu as a metal-containing conductive material, the plating seed layer 34 comprises Cu, CuAl, CuIr, CuTa, CuRh, or other alloys of Cu, i.e., Cu-containing alloys.

The plating seed layer 34 can be formed by a conventional deposition process including, for example, ALD, CVD, PECVD, PVD, chemical solution deposition and other like deposition processes. The thickness of the plating seed layer 34 may vary and it is within ranges that are well known to those skilled in the art. Typically, the plating seed layer 34 has a thickness from 2 nm to 80 nm.

In some embodiments of the present invention, plating seed layer 34 is formed at a deposition temperature of 30° C. or less, with a deposition temperature from 20° C. to −30° C. being preferred. Such low temperature depositions avoid subsequent conductive material agglomeration within the at least one opening.

Figure 5:
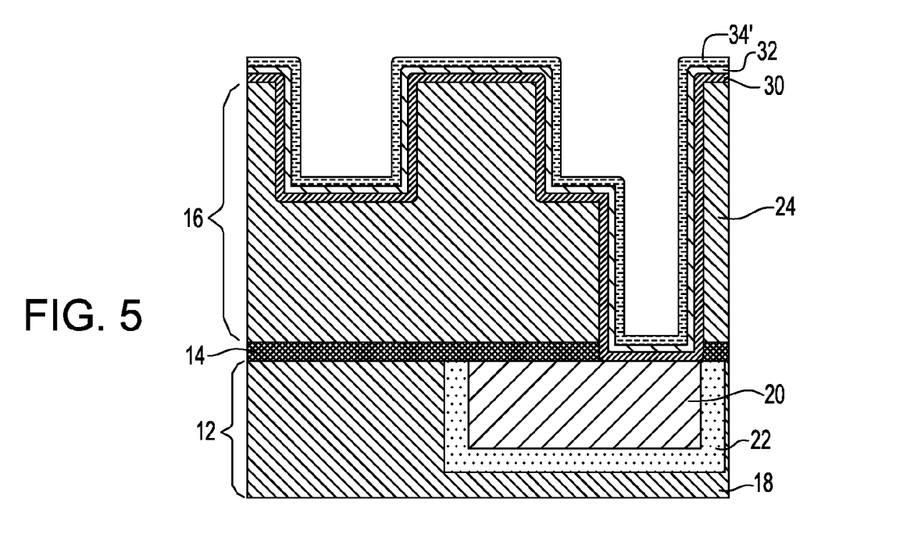
FIG. 5 is a pictorial representation (through a cross sectional view) illustrating the interconnect structure of FIG. 4 after performing a first anneal that agglomerates the plating seed layer.

FIG. 5 shows the structure that is formed after subjecting the structure shown in FIG. 4 to a first anneal. The first anneal is performed under conditions which cause substantial agglomeration of the plating seed layer 34. In FIG. 5, the agglomerated plating seed layer that is formed by this first anneal is designated as 34'. Although FIG. 5 depicts the agglomerated plating seed layer 34' as a continuous layer, the agglomerated plating seed layer 34' may be discontinuous including breaks within the layer. When the agglomerated plating seed layer 34' is discontinuous, portions of the underlying diffusion barrier or second dielectric material may be exposed. It is observed that much of the agglomeration of the plating seed layer 34 occurs within the at least one opening, not on horizontal surfaces of the interconnect structure.

Without wishing to be bound by any theory, it is believed that the agglomerated plating seed layer 34' has fairly large metallic grains inside the at least one opening. These large metallic grains are the seed crystallites for grain growth of the later-deposited metal-containing conductive material. Since these large metallic grains, e.g., seed crystallite, are already present within the at least one opening, a conductive structure having a large grain size can be obtained during a post conductive material deposition anneal.

The first anneal that causes the substantial agglomeration of the plating seed layer 34 is typically performed at a temperature from 200° C. to 400° C., with a temperature from 250° C. to 300° C. being more typical. In one embodiment, the first anneal is performed in a reducing atmosphere such as, for example, $H_2$, $N_2$ or a mixture thereof. In another embodiment, the first anneal is performed under vacuum. The first anneal is performed for a period of time which causes sufficient agglomeration of the plating seed layer 34 within the at least one opening. Typically, the anneal is performed for a time period of 100 minutes or less, with a time period of 30 minutes or less being more typical.

In some embodiments of the invention, another plating seed layer (not shown) can be formed atop the agglomerated plating seed layer 34'. The another plating seed layer may comprise the same or different plating seed material as plating seed layer 34. Typically, the another plating seed layer (not shown) is comprised of the same plating seed material as plating seed layer 34. The another plating seed layer can be formed utilizing one of the deposition techniques mentioned above with respect to plating seed layer 34. Also, the another plating seed layer can have a thickness within the range mentioned above for plating seed layer 34. The another plating seed layer is used to ensure that no portions of the underlying diffusion barrier or second dielectric material are exposed during subsequent formation of the conductive structure.

Figure 6:
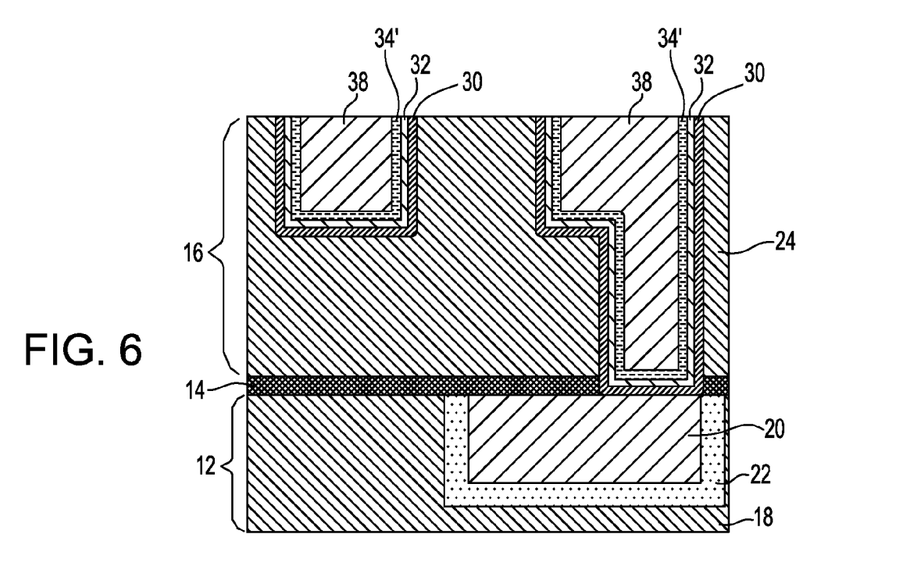
FIG. 6 is a pictorial representation (through a cross sectional view) illustrating the interconnect structure of FIG. 5 after forming a conductive structure within the at least one opening. In the illustrated structure, a closed-via bottom is illustrated on the right hand side.
Figure 7A:
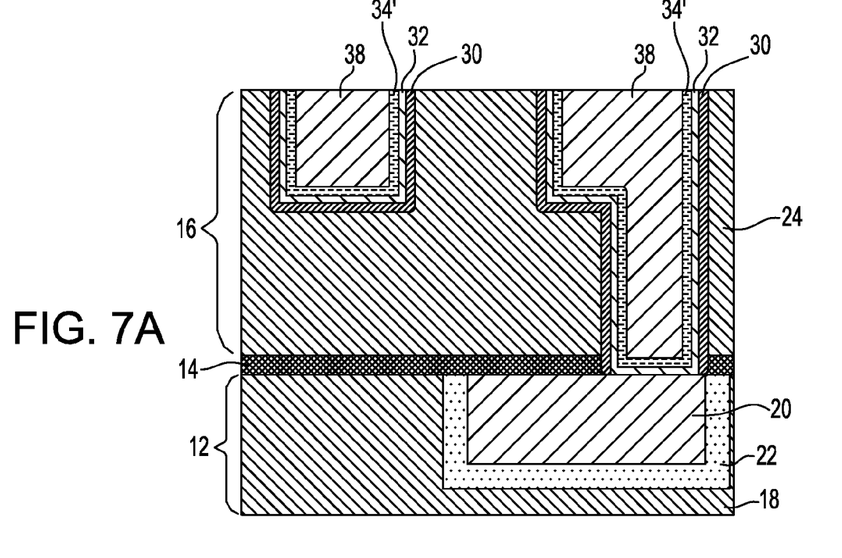
Figure 7B:
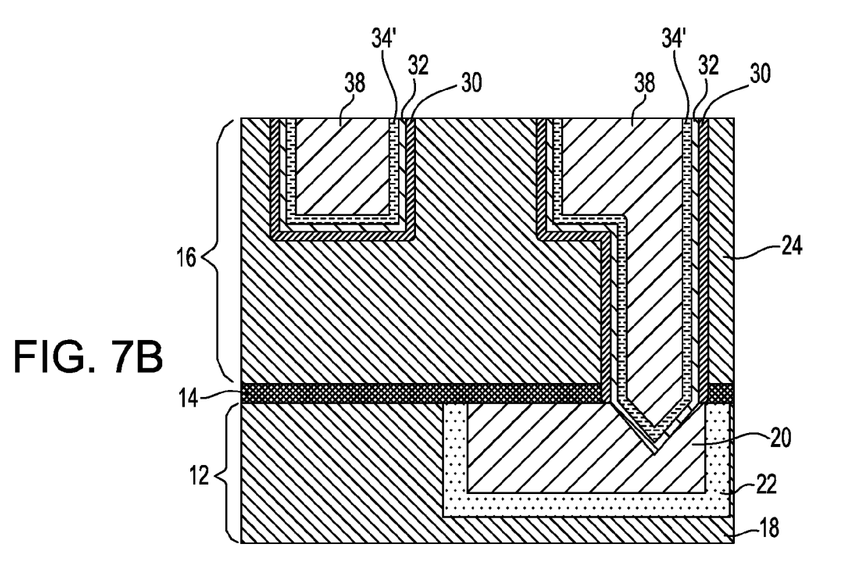

FIG. 6 shows the structure after forming a conductive structure 38 within the at least one opening. The interconnect structure shown in FIG. 6 represents one possible embodiment of the present invention, while the interconnect structures shown in FIGS. 7A and 7B represent other possible embodiments of the present invention. In FIG. 6, a closed-via bottom interconnect structure is shown. In FIG. 7A, the conductive structure 38 is formed within an open-via bottom structure. The open-via interconnect structure is formed by removing the optional diffusion barrier 30 from the bottom of via 28A utilizing ion bombardment or another like directional etching process prior to deposition of the other elements. In FIG. 7B, an anchored-via bottom interconnect structure is shown. The anchored-via bottom interconnect structure is formed by first etching a recess into the conductive feature 20 utilizing a selective etching process. The optional diffusion barrier 30 is then formed and it is selectively removed from the bottom portion of the via and recess by utilizing one of the above-mentioned techniques. The other elements, i.e., GGPL 32, agglomerated plating seed layer 34', and conductive structure 38, are then formed as described herein.

In each of the illustrated structures, the conductive structure 38 may comprise the same or different, preferably the same, metal-containing conductive material as that of the conductive feature 20; note that the conductive material used in forming the conductive structure 38 does not include polySi. Preferably, Cu, Al, W or alloys thereof are used as the metal-containing conductive material of conductive structure 38, with Cu or AlCu being most preferred. The metal-containing conductive material of conductive structure 38 is formed utilizing the same deposition processing as described above in forming the conductive feature 20. Following the deposition of the metal-containing conductive material within the at least one opening, a second anneal is performed that causes the formation of conductive structure 38. The second anneal which is used in forming the conductive structure 38 is typically performed at a temperature from 80° C. to 300° C., with a temperature from 100° C. to 200° C. being more typical. The second anneal is typically performed in an inert ambient such as, for example, $N_2$, He and/Ar. The duration of the second anneal may vary. Typically, and by way of an example, the second anneal is performed for a time period of 60 minutes or less.

The conductive structure 38 thus formed includes a metal-containing conductive material as mentioned above. The conductive structure 38 further has a bamboo microstructure and an average grain size of larger than 0.05 microns. In one embodiment, the average grain size of the conductive structure 38 is from 0.05 microns to 0.5 microns. In another embodiment, the average grain size of the conductive structure 38 is from 0.08 microns to 0.2 microns. In some embodiments, the conductive structure 38 includes conductive grains that have a (111) crystal orientation. The term "bamboo microstructure" is used herein to denote that the conductive material of the conductive structure 38 is composed of grains all of which are larger than the cross sectional dimensions of the interconnect. A bamboo microstructure is different from a near bamboo microstructure which is a mixture of bamboo and polycrystalline microstructures along the length of the interconnect structure.

After the deposition of the conductive material, the interconnect structure can be subjected to planarization. The planarization process, which can occur prior to, or after the second anneal, removes the optional diffusion barrier 30, GGPL 32, agglomerated plating seed layer 34' and conductive structure 38 that are present above the upper horizontal surface of the upper interconnect level 16.

The method of the present application is applicable in forming such a conductive structure as a conductive feature in any one or all of the interconnect levels of an interconnect structure. The same basic processing steps can be used to form other semiconductor structures, such as, for example, a field effect transistor, in which the conductive material is a gate electrode that has the inventive microstructure and average grain size.

The effects of the grain size and morphology of the conductive structure 38 within an interconnect structure include the following: (i) The relatively large grain size of the conductive structure 38 provides a conductive structure 38 that has a low number of grain boundaries as compared to other morphologies, a low electron scattering effect (on the order of 10%~30% less than that of the prior art), and a relatively low electrical resistance (on the order of about 10%~30% less than that of the prior art. Because of these properties, the interconnect structure of the present invention exhibits better performance than conventional interconnect structure. (ii) The bamboo microstructure provides less electromigration paths inside the conductive structure, high electromigration resistance, and can withstand current density (of greater than 6 mA/µm$^2$), and thus, better circuit reliability.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An interconnect structure comprising:
   a dielectric material including at least one opening therein;
   a grain growth promotion layer located within the at least one opening;
   an agglomerated plating seed layer located above upper surfaces of said grain growth promotion layer; and
   a conductive structure located within the at least one opening and atop upper surfaces of the agglomerated plating seed layer, said conductive structure comprising a metal-containing conductive material having a bamboo microstructure, an average grain size of larger than 0.05 microns, and conductive grains that have a (111) crystal orientation.

2. The interconnect structure of claim 1 wherein said dielectric material is one of SiO$_2$, a silsesquioxane, a C doped oxide that includes atoms of Si, C, O and H, or a thermosetting polyarylene ether.

3. The interconnect structure of claim 1 wherein said at least one opening is a line opening, a via opening, a combined line opening and via opening, or combinations thereof.

4. The interconnect structure of claim 1 wherein said grain growth promotion layer comprises Ru, Co, Ir, Rh, Mo, Re, Hf, Nb or alloys thereof.

5. The interconnect structure of claim 1 wherein said grain growth promotion layer has a thickness from 0.5 nm to 10 nm.

6. The interconnect structure of claim 1 further comprising a diffusion barrier located beneath said grain growth promotion layer, said diffusion bather comprising Ta, TaN, Ti, TiN, Ru, RuN, W, WN or any other material that can serve as a barrier to prevent conductive material from diffusing there through.

7. The interconnect structure of claim 1 wherein said agglomerated plating seed layer comprises Cu or a Cu-containing alloy.

8. An interconnect structure comprising:
   a dielectric material including at least one opening therein;
   a grain growth promotion layer located within the at least one opening;
   an agglomerated plating seed layer located above upper surfaces of said grain growth promotion layer; and
   a conductive structure located within the at least one opening and atop upper surfaces of the agglomerated plating seed layer, said conductive structure comprising a metal-containing conductive material having a bamboo microstructure and an average grain size of larger than 0.05 microns, wherein another plating seed layer is located between said agglomerated plating seed layer and said conductive structure.

9. The interconnect structure of claim 1 wherein said metal-containing conductive material of said conductive structure includes a conductive metal, an alloy comprising at least one conductive metal, or a conductive metal silicide.

10. The interconnect structure of claim 9 wherein said metal-containing conductive material is a conductive metal selected from the group consisting of Cu, Al, W and AlCu.

11. The interconnect structure of claim 1 wherein said conductive structure is present in an open-via bottom, an anchored-via bottom structure or a closed-bottom via.

12. The interconnect structure of claim 1 wherein said conductive structure is a copper-containing conductive structure.

13. A method of forming an interconnect structure comprising:
    forming at least one opening in a dielectric material;
    forming a grain growth promotion layer within said at least one opening;
    forming an agglomerated plating seed layer within the at least one opening; and
    forming a conductive structure within said at least one opening atop said agglomerated plating seed layer, said conductive structure including a metal-containing conductive material having a bamboo microstructure, an average grain size of larger than 0.05 microns, and conductive grains that have a (111) crystal orientation.

14. The method of claim 13 further comprising forming a diffusion barrier within the at least one opening prior to forming said grain growth promotion layer.

15. The method of claim 13 wherein said forming said grain growth promotion layer occurs at a deposition temperature of 400° C. or less.

16. The method of claim 13 wherein said forming the agglomerated plating seed layer comprising depositing a plating seed layer; and subjecting the plating seed layer to an anneal.

17. The method of claim 16 wherein said anneal is performed at a temperature from 200° C. to 400° C. in a reducing atmosphere or under vacuum.

18. A method of forming an interconnect structure comprising:

forming at least one opening in a dielectric material;

forming a grain growth promotion layer within said at least one opening;

forming an agglomerated plating seed layer within the at least one opening;

forming another plating seed layer atop the agglomerated plating seed layer; and forming a conductive structure within said at least one opening atop said agglomerated plating seed layer, said conductive structure including a metal-containing conductive material having a bamboo microstructure and an average grain size of larger than 0.05 microns.

19. The method of claim 13 wherein said forming the conductive structure comprises depositing the metal-containing conductive material within the at least one opening; and annealing the metal-containing conductive material.

20. The method of claim 19 wherein said annealing is performed at a temperature from 80° C. to 300° C.

21. The method of claim 13 wherein said conductive structure is a copper-containing conductive structure.

* * * * *